United States Patent [19]

Noro

[11] Patent Number: 4,944,020
[45] Date of Patent: Jul. 24, 1990

[54] TEMPERATURE COMPENSATION CIRCUIT FOR NEGATIVE IMPEDANCE DRIVING APPARATUS

[75] Inventor: Masao Noro, Hamamatsu, Japan

[73] Assignee: Yamaha Corporation, Hamamatsu, Japan

[21] Appl. No.: 357,701

[22] Filed: May 26, 1989

[30] Foreign Application Priority Data

May 31, 1988 [JP] Japan .................. 63-133389
Jun. 29, 1988 [JP] Japan .................. 63-161992

[51] Int. Cl.$^5$ .............................................. H04R 3/00
[52] U.S. Cl. ............................................... 381/96
[58] Field of Search ................................. 381/96, 55, 59

[56] References Cited

U.S. PATENT DOCUMENTS

| | | | |
|---|---|---|---|
| 4,387,270 | 6/1983 | Sakano et al. ................ | 381/96 |
| 4,395,588 | 7/1983 | Franssen et al. ............. | 381/96 |
| 4,550,430 | 10/1985 | Meyers ........................ | 381/96 |
| 4,573,189 | 2/1986 | Hall ............................ | 381/96 |
| 4,837,832 | 6/1989 | Fanshel ....................... | 381/105 |

*Primary Examiner*—Forester W. Isen
*Attorney, Agent, or Firm*—Spensley, Horn, Jubas & Lubitz

[57] ABSTRACT

A tempeature compensation circuit used in a negative impedance driving apparatus such as an amplifier for driving a speaker as a load. A current flowing through the load is detected by a detection element connected to the load, and fed back therefrom, so that negative impedance driving is effected on the load. The detection element is set its temperature coefficient to be equal to or slightly larger than a temperature coefficient of the load, thereby the positive feedback gain is changed upon changing the temperature of the load so that negative impedance driving state is compensated. In another aspect of the invention, a temperature sensitive element or temperature detecting element for sensing or detecting the temperature of the detection element is arranged to change the positive feedback gain and compensate the negative impedance driving state.

2 Claims, 4 Drawing Sheets

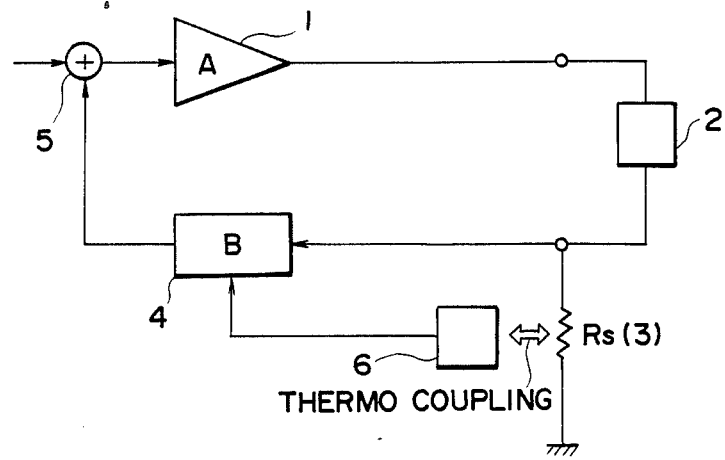
F I G. 2
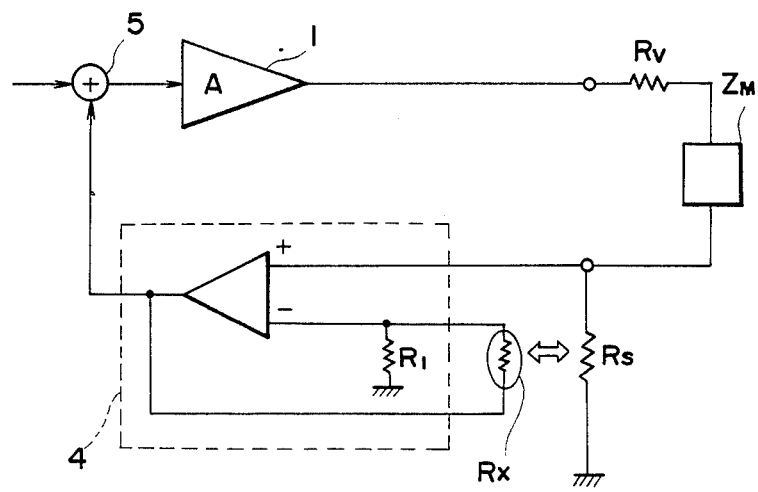
F I G. 3

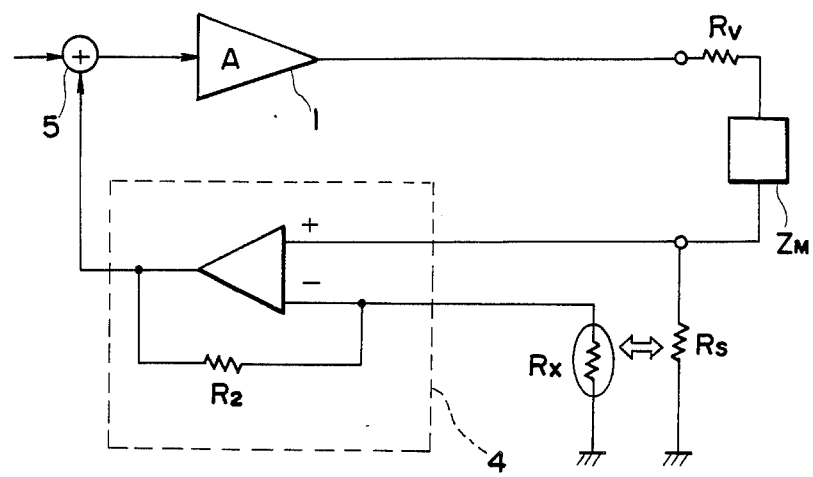
F I G. 4
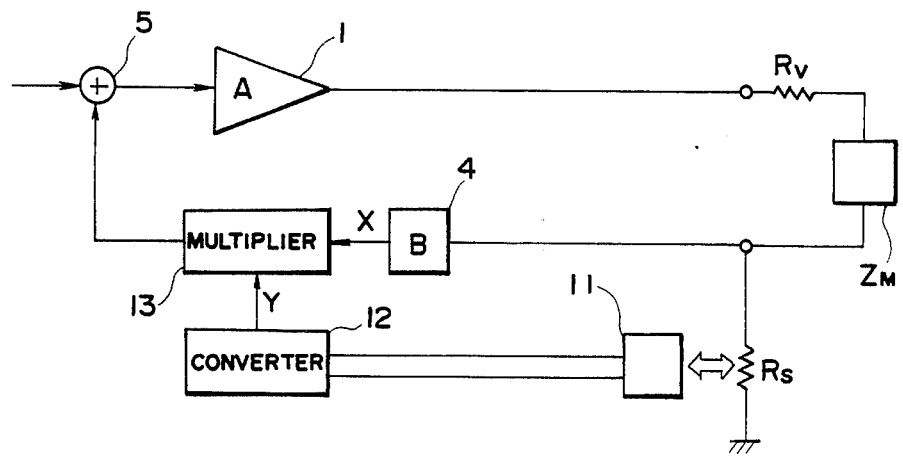
F I G. 5

TEMPERATURE COMPENSATION CIRCUIT FOR NEGATIVE IMPEDANCE DRIVING APPARATUS

BACKGROUND OF THE INVENTION (Field of the Invention)

The present invention relates to a temperature compensation circuit used in an apparatus for negative-impedance driving a load and, more particularly, to a temperature compensation circuit used for efficiently compensating for a variation in drive state caused by a change in temperature of a load.

(Description of the Prior Art)

In general, an electro-magnetic transducer (dynamic electro-acoustic transducer) such as a speaker has a coil (voice coil) disposed in a magnetic gap of a magnetic circuit, and a drive current i flows through the coil to drive a diaphragm or the like. The coil has an inherent internal impedance including a DC resistance component.

Since the coil formed of a copper wire has a positive temperature coefficient, its resistance changes depending on a temperature. If the length of the copper wire coil is presented by l, and the intensity of the magnetic field of the magnetic gap is represented by B, a drive force F appearing at the copper wire coil is given by:

$$F = B \cdot l \cdot i$$

Therefore, in the case of constant-voltage driving, the drive force changes depending on a temperature. The above-mentioned electro-magnetic conversion system generally has a motional impedance, and the resistance component of the copper wire coil serves as a damping resistance of this motional impedance. Therefore, a damping force also changes in accordance with a change in temperature.

In a speaker system provided with the speaker as the electro-magnetic conversion system described above, the internal impedance inherent in the voice coil of the speaker seriously influences the resonance Q value and the lowest resonance frequency $f_0$ of sound pressure characteristics.

The present applicant paid attention to the above fact, and filed a patent application for an acoustic reproduction apparatus which can equivalently invalidate or eliminate a DC resistance component of the voice coil (U.S. Pat. application Nos. 286,869 and 287,381, and the like; not disclosed). FIG. 6(a) is an equivalent circuit diagram showing the concept of the above-mentioned apparatus. In FIG. 6(a), reference symbols $C_M$ and $L_M$ denote a capacitance component and an inductance component of a motional impedance $Z_M$ of an electro-magnetic transducer (speaker), respectively; and $R_V$, an internal resistance of a voice coil as a load. The internal resistance $R_V$ is eliminated by a negative resistance $-R_A$ equivalently formed at the driving side, and an apparent drive impedance $Z_A$ is given by:

$$Z_A = R_V - R_A$$

If $Z_A$ becomes negative, the circuit operation is rendered unstable. Therefore, the values of $R_V$ and $R_A$ are set as $R_V \geq R_A$.

According to this acoustic reproduction apparatus, the resonance Q value of a unit vibration system constituted by a speaker ideally becomes zero, and the concept of the lowest resonance frequency $f_0$ is also lost. When the above resonator is driven, since the resonance Q value need not be decreased, a strong resonance acoustic wave radiation can be realized.

In order to achieve such negative-impedance driving, the negative impedance must be equivalently generated. For this purpose, a detection element $R_S$ as a current detection element 3 is connected in series with the speaker as a load 2. FIG. 6(b) is a circuit diagram of a negative impedance generator. As shown in FIG. 6(b), the detection resistor $R_S$ is connected to the load 2 (internal resistance $R_V$), and its detection output is supplied to an adder 5 through a feedback circuit 4 of a feedback gain $\beta$ to be positively fed back to an amplifier 1 of a gain A. Therefore, an equivalent output impedance $R_0$ with respect to the load 2 is given by:

$$R_0 = R_S(1 - A \cdot \beta)$$

However, in the conventional method, the following problems are posed.

In the negative-impedance driving system, both the large drive force and damping force can be realized. However, unless appropriate temperature compensation is performed for a change in DC resistance $R_V$ of the voice coil caused by a change in temperature of the voice coil of the speaker, a drive state varies more largely than in the case of the normal constant-voltage driving. In the negative-impedance driving system, it is difficult to make constant the drive impedance with respect to the motional impedance of the voice coil or the like of the speaker over a wide temperature range. For example, in the circuit shown in FIG. 6(a), since the drive resistance is $(R_V - R_A)$, if the equivalent negative resistance $-R_A$ is set to be constant regardless of a temperature, the ratio of influence of a change in resistance $R_V$ caused by a change in temperature with respect to the drive state becomes larger than that in the case of the constant-voltage driving. There is no conventional means for positively compensating for a change in temperature of the internal resistance $R_V$.

In some apparatuses, a coil for detecting the temperature of a drive coil as a load formed of the same material (e.g., copper) as the drive coil is attached near the drive coil. The coil for detecting the temperature does not serve as a normal coil, and is merely utilized as a resistor whose resistance changes depending on a temperature.

In a method wherein the coil (detection coil) for detecting the temperature is used in addition to the coil as the load, however, an extra terminal for the detection coil is required. Since the mass of the entire coil is increased by the detection coil, if it is applied to the speaker, the vibration system itself undesirably becomes heavy. Furthermore, wirings to the speaker unit cannot be realized by two terminals, thus disturbing compatibility.

SUMMARY OF THE INVENTION

It is therefore an object of the present invention to provide a temperature compensation circuit for a driving apparatus, which can compensate for the variation in drive state of a load with a simple arrangement even if the load impedance of a load changes due to the change in temperature of the load.

In a temperature compensation system according to a first aspect of the present invention, a current flowing through a load is detected by a detection means connected to the load, and is fed back therefrom. The temperature coefficient of a detection impedance of the detection means used in a driving apparatus for effecting the negative-impedance driving of the load is set to be equal to or slightly larger than a temperature coefficient of the load impedance of the load. A heat radiation resistance of the detection means is preferably set to be equal to or slightly larger than a value obtained by multiplying a heat radiation resistance of the load with the load impedance and dividing the multiplication product with the detection impedance, and a thermal time constant of the detection means is preferably set to be almost equal to that of the load.

With the above arrangement, since the detection means for detecting the current is connected to the load, when the load is energized, a current also flows through the detection means. In this case, since the temperature coefficient of the load impedance of the load is set to be almost equal to or slightly smaller than that of the detection impedance of the detection means, if the load and the detection means are assumed to be at the same temperature, the influence of a change in temperature of a drive impedance can be eliminated. If the heat radiation resistance of the detection means is set to be equal to or slightly larger than a value obtained by multiplying the heat radiation resistance of the load with the load impedance and dividing the product with the detection impedance, and the thermal time constant of the detection means is preferably set to be almost equal to that of the load, the temperatures of the load and the detection means can be almost equalized. Therefore, satisfactory temperature compensation can be performed while a two-terminal structure is left unchanged.

In a temperature compensation circuit according to a second aspect of the present invention used in a speaker driving amplifier in which a detection output of a current detection means inserted in series with a speaker as a load is positively fed back to an input side to generate a negative resistance component in an output impedance, thereby equivalently eliminating or invalidating the DC resistance component of voice coil of the speaker, the current detection means is formed of a member which has a heat radiation resistance and a thermal time constant which allow an increase in temperature almost equivalent to that of a voice coil material of the speaker, and a temperature sensitive means which has a predetermined temperature coefficient is thermally coupled to the current detection means, so that a feedback amount of a positive feedback operation is controlled by an electrical amount corresponding to the temperature of the temperature sensitive means.

In place of the temperature sensitive means, a temperature detection means thermally coupled to the current detection means may be arranged, and a multiplication means for multiplying a detection signal from the temperature detection means with a feedback gain of the positive feedback operation may be arranged.

According to this arrangement, since a drive current flowing through the voice coil of the speaker directly flows through the current detection means, the current detection means exhibits almost the same increase in temperature as the temperature of the voice coil is increased. The current detection means and the temperature sensitive means or temperature detection means are thermally coupled to each other, thereby controlling the positive feedback operation. Therefore, the above-mentioned temperature control can be achieved.

BRIEF DESCRIPTION OF THE DRAWINGS:

FIG. 2 is a circuit diagram showing a second embodiment of the present invention;

FIGS. 3 and 4 are detailed circuit diagrams of FIG. 2, respectively;

FIG. 5 is a circuit diagram showing a circuit arrangement of a third embodiment of the present invention.

Figure 1:
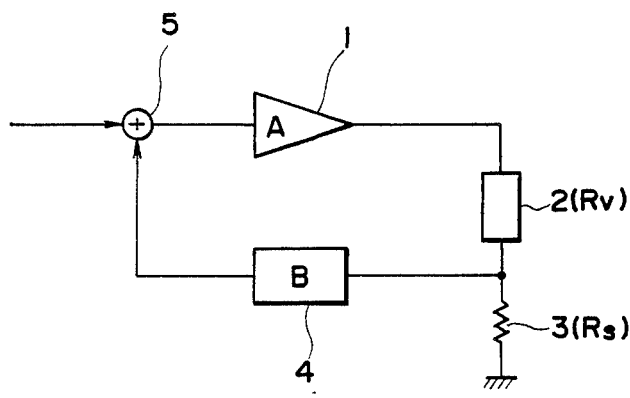
FIG. 1 is a circuit diagram of a negative impedance driver to which a first embodiment of the present invention is applied.

DETAILED DESCRIPTION OF THE PREFERRED EMBODIMENTS:

Embodiments of the present invention will now be described with reference to FIGS. 1 to 5. The same reference numerals denote the same parts throughout the drawings, and a repetitive description thereof will be avoided.

[First Embodiment]

Figure 6A:
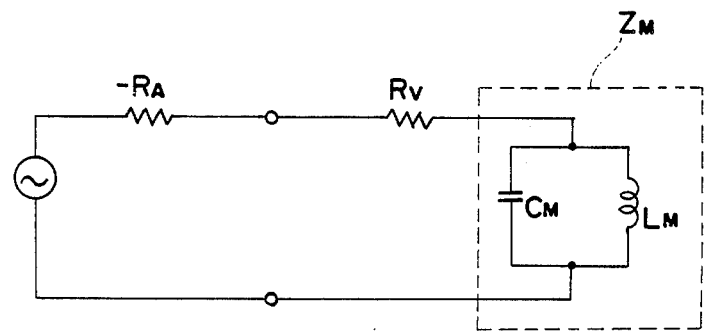
FIGS. 6(a) and 6(b) are circuit diagrams showing an equivalent circuit of a dynamic electro-acoustic transducer and a negative impedance generator, respectively, for explaining the prior application.
Figure 6B:
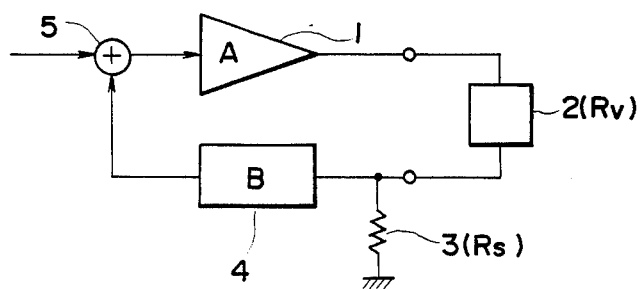

FIG. 1 is a circuit diagram of a negative impedance generator according to an embodiment of the present invention. This circuit has substantially the same arrangement as that of the negative impedance generator shown in FIG. 6(b), except that an element having specific temperature characteristics is used as a detection resistor 3 or the detection resistor 3 has the specific temperature characteristics. In FIG. 1, a voice coil (having an internal resistance of $R_V$) as a load 2 is connected to the output of an amplifier 1 of a gain A. A detection resistor (having a resistance of $R_S$) as a detection element 3 is connected to the load 2. A connecting node between the load 2 and the detection element (detection means) 3 is connected to a feedback circuit 4 of a transmission gain $\beta$, and the output of the detection element is positively fed back to the amplifier 1 through an adder 5. When the load 2 is negative-impedance driven, the load 2 and the detection element 3 are assumed to be at the same temperature, and a load impedance $Z_V (=R_V)$ of the load 2 and a detection impedance $Z_S (=R_S)$ are assumed to have the same temperature coefficient.

In the circuit shown in FIG. 1, a drive impedance to the load 2 (an output impedance of the circuit) is given by:

$$R_S \cdot (1 - A\beta)$$

Therefore, when $A\beta < 1$, the drive impedance can be negative, and the load 2 can be negative-impedance driven. If the resistance of the load impedance $R_V$ at 0° C. is represented by $R_{V0}$, the temperature coefficient of the material of the load 2 is represented by $K_T$, and the temperature of the load 2 is represented by T (°C.), the load impedance $R_V$ is expressed by:

$$R_V = (1 + K_T T) R_{V0}$$

Therefore, the drive impedance with respect to the motional impedance $Z_M$ of the load 2 is given by:

$$R_V + R_S(1 - A\beta) = (1 + K_T T)R_{V0} + R_S(1 - A\beta)$$

If the detection impedance $R_S$ has the same temperature coefficient as that of the load impedance $R_V$, when the load 2 and the detection element 3 are at the same temperature, the influence of a change in temperature when $(1-A\beta)$ is negative can be eliminated.

If the detection impedance $R_S$ and the load impedance $R_V$ are assumed to have the same temperature coefficient and the resistance of the detection impedance $R_S$ at 0° C. is represented by $R_{S0}$, the following equation is established in the circuit show in FIG. 2:

$$R_V - R_A = (1 + K_T T) R_{V0} + (1 + K_T T) R_{S0} (1 - A\beta)$$
$$= (1 + K_T T)[R_{V0} + R_{S0} (1 - A\beta)]$$

Even if $(1-A\beta)$ is negative, the influence of the temperature coefficient can be equivalent to that in the case of constant-voltage driving.

The above description has been made under an assumption that the load 2 having the load impedance $R_V$ and the detection element 3 having the detection impedance $R_S$ are at almost the same temperature. When the load 2 and the detection element 3 are to be maintained at the same temperature, the first problem is a space condition where the load 2 and the detection element 3 are arranged. However, in a speaker such as a dynamic electro-magnetic transducer, irrespective of whether the detection element 3 is arranged either at the speaker side or drive side, these two locations are present in an identical chamber, and there is no problem. The second problem is heat generation upon energization of the load 2 itself. If a drive current is represented by I, power consumption at the load impedance $R_V$ is given by $I^2 R_V$. However, since the drive current I flows through the load 2 and the detection element 3 at the same time, power of $I^2 R_S$ is consumed at the detection impedance $R_S$, and hence, heat generation also occurs here. If heat radiation resistances of the load 2 and the detection element 3 are respectively represented by $\theta_V$ and $\theta_S$, increases in temperature caused by heat generation of the load 2 and detection element 3 can be equalized when the following condition is satisfied:

$$I^2 R_V \theta_V = I^2 R_S \theta_S$$

In order to satisfy the above relation, the following relation must be satisfied:

$$\theta_S = (R_V/R_S)\theta_V$$

This can be achieved by adjusting an area of the detection element 3 contacting an air.

A heat generating member generally has a thermal time constant. The thermal time constants of the load 2 and the detection element 3 are preferably set to be equal to each other. When the time constant of the heat radiation resistance $\theta_S$ of the detection element 3 is changed while the heat radiation resistance $\theta_S$ of the detection element 3 is left unchanged, the shape of the radiator can be changed while keeping the same heat radiation area. If the radiator is formed of an identical material, its mass can be increased to increase the thermal time constant. Furthermore, the thermal time constant can be increased using a material having a large specific heat.

According to the method described above, an increase in ratio of the influence of a change in temperature caused by negative-impedance driving can be suppressed to an equal level in the case of constant-voltage driving. However, a change in temperature equivalent to that in the constant-voltage driving is inevitable. Thus, the influence of a change in temperature can be further eliminated as follows.

In a first method, a temperature coefficient $K_{TS}$ of the detection impedance $R_S$ of the detection element 3 is set to be slightly larger than a temperature coefficient $K_{TV}$ of the load impedance $R_V$ of the load 2 ($K_{TS} > K_{TV}$). Thus, if the temperatures of the load 2 and the detection element 3 are respectively $T_V$ and $T_S$, the drive impedance with respect to the motional impedance $Z_M$ is given by:

$$R_V - R_A = (1 + K_{TV}T_V)R_{V0} + (1 + K_{TS}T_S)R_{S0}(1 - A\beta)$$

A factor which changes upon a change in temperature is:

$$K_{TV}T_V R_{V0} + K_{TS}T_S R_{S0}(b\ 1 + A\beta)$$

In order to set this factor to be "0", $$R_{V0}/[R_{S0}(1 - A\beta)] = -(K_{TS}T_S)/K_{TV}T_V$$

Therefore, if $T_S \approx T_V$, the detection element 3 having the temperature coefficient $K_{TS}$ given by the following equation can be used:

$$K_{TS} \approx -(R_{V0}K_{TV})/[R_{S0}(1 - A\beta)]$$

When $(1 - A\beta) < 0$, $K_{TS}$ can be set as follows:

$$K_{TS} = (R_{V0}K_{TV})[R_{S0}(1 - A\beta)]$$

In a second method, the heat radiation resistance $\theta_S$ of the detection element 3 is set to be slightly larger than that of the load 2. If $K_{TS}\sigma K_{TV}$, from the above equation, since $$R_{V0}/[R_{S0}(1 - A\beta)] = -(K_{TS}T_S)/(K_{TV}T_V)$$

then, $$R_{V0}/[R_{S0}(1 - A\beta)] = -T_S/T_V$$

If $(1-A\beta)<0$, the following equation must be established:

$$R_{V0}/|R_{S0}(1 - A\beta)| = T_S/T_V$$

The heat radiation resistance $\theta_S$ of the detection impedance $R_S$ of the detection element 3 is designed to be larger than a value given by:

$$\theta_S = (R_V \theta_V)/R_S$$

which is obtained by:

$$T_S = I^2 R_S \theta_S$$

$$T_V = I^2 R_V \theta_V$$

Thus, the following equation can be established:

$$R_{V0}/|R_{S0}(1 - A\beta)| = T_S/T_V$$

In the description of the embodiment, the load impedance of the load 2 is the internal resistance $R_V$ of the voice coil, and the detection impedance of the detection element 3 is the detection resistance $R_S$. However, the present invention is not limited to these. For example, the impedances may include an inductance component or a capacitance component. For example, the internal impedance $Z_V$ of the copper wire coil is mainly the resistance component $R_V$ and slightly includes an inductance component $L_V$. In this case, the detection element 3 is provided with a detection inductance $L_S$ in addition to the detection resistance $R_S$ and temperature coefficients of $L_V$ and $L_S$ are set to be almost equal to each other.

As described above, according to the first aspect of the present invention, since the temperature coefficient of the load impedance of the load is set to be almost equal to or slightly smaller than the temperature coefficient of the detection impedance of the detection means, if the load and the detection means are assumed to be at the same temperature, the influence of a change in temperature of the drive impedance can be eliminated. In this case, the heat radiation resistance of the detection means is set to be equal to or slightly larger than a value obtained by multiplying the load impedance with the heat radiation resistance of the load and dividing the product (the result of multiplying) with the detection impedance, so that the temperatures of the load and the detection means can be set to be almost equal to each other.

For this reason, even if the load impedance changes due to a change in temperature of the load in the negative-impedance driving, a variation in drive state of the load can be prevented while a two-terminal structure is left unchanged.

[Second Embodiment]

FIG. 2 is a circuit diagram of a negative impedance driver according to a second embodiment of the present invention. A difference between the circuit shown in FIG. 2 and the circuit shown in FIG. 6 (b) is that a temperature sensitive resistor element 6 (e.g., thermistor) thermally coupled to a detection resistor $R_S$ as a current detection means 3 is arranged, and is connected to a feedback circuit 4. A heat radiation resistance and a thermal time constant of the detection resistor $R_S$ shown in FIG. 2 are set so that an increase in temperature of a voice coil of a speaker 2 is almost equal to an increase in temperature of the detection resistor $R_S$. According to the second embodiment, since a feedback gain $\beta$ of the feedback circuit 4 can be controlled in accordance with an increase in temperature of the detection resistor $R_S$, temperature compensation can be satisfactorily performed.

This will be described in detail below with reference to FIG. 3. In FIG. 3, the detection resistor $R_S$ has a temperature coefficient of the same polarity as that of a voice coil $R_V$ of the speaker 2 (when the voice coil $R_V$ has a positive temperature coefficient like copper, the detection resistor $R_S$ also has a positive temperature coefficient). In this case, since the feedback gain $\beta$ is given by:

$$\beta = 1 + R_X/R_1$$

wherein the $R_X$ is a resistance value of a thermistor as the temperature sensitive resister element 6, the drive impedance of an equivalent motional impedance $Z_M$ is:

$$R_V + R_S\{1 + A(1 + R_X/R_1)\} \quad (1)$$

Since only the voice coil $R_V$ and the temperature sensitive resistor $R_X$ have significant temperature coefficients, formula (1) can be rewritten by extracting this as follows:

$$R_V - R_S A(R_X/R_1) \quad (2)$$

If this formula yields zero, since this means that temperature compensation can be ideally performed, $$R_V = R_S A(R_X/R_1)$$

For the voice coil $R_V$ and the temperature sensitive resistor $R_X$, $$R_V = R_{V0}(1 + K_{TV} \cdot T_V)$$

$$R_X = R_{X0}(1 + K_{TX} \cdot T_X)$$

where
  $R_{V0}$: value of $R_V$ at 0° C.
  $K_{TV}$: temperature coefficient of $R_V$
  $T_V$: temperature of $R_V$
  $R_{X0}$: value of $R_X$ at 0° C.
  $K_{TX}$: temperature coefficient of $R_X$
  $T_X$: temperature of $R_X$ Therefore, formula (2) can be rewritten as:

$$R_{V0}(1 + K_{TV} \cdot T_V) = R_S \cdot A \cdot R_{X0}(1 + K_{TX} \cdot T_X)/R_1$$

Since $T_V \approx T_X$ by the above-mentioned thermal coupling, the influence of the temperature can be almost eliminated by using the temperature sensitive resistor $R_X$ having the temperature coefficient $T_X$ given by:

$$(1 + (K_{TV} \cdot T_V)/(1 + K_{TX} \cdot T_X) \approx (R_S \cdot A \cdot R_{X0})/(R_{V0} \cdot R_1)$$

Note that when the temperature sensitive resistor $R_X$ having the temperature coefficient of an opposite polarity to that of the voice coil $R_V$ is used, the circuit arrangement shown in FIG. 4 can be employed. More specifically, in FIG. 4, the temperature sensitive resistor $R_X$ is connected to the temperature compensation input terminal of the feedback circuit 4, while in the circuit shown in FIG. 3, such a temperature sensitive resistor $R_X$ is connected to the negative feedback system of an amplifier provided in the feedback circuit 4.

[Third Embodiment]

A third embodiment of the present invention will be described hereinafter with reference to FIG. 5.

FIG. 5 is a circuit diagram of the third embodiment. In this embodiment, a temperature detection element 11 is thermally coupled to a detection resistor $R_S$, and a detection signal (parameter of change in temperature) from the element 11 is supplied to a transducer 12 to be converted to a voltage signal (Y). The voltage signal (Y) is supplied to a multiplier 13 and is multiplied with a feedback signal (X) from a feedback circuit 4, and the product (X·Y) supplied to an adder 5.

In this circuit, the drive impedance of an equivalent motional impedance $Z_M$ is given by:

$$R_V + R_S(1 - A\beta Y) \quad (3)$$

If the voice coil resistance at 0° C. is represented by $R_{V0}$, the voice coil resistance $R_V$ at $T_V$ is given by:

$$(1+K_{TV}\cdot T_V)R_{V0} \quad (4)$$

Therefore, formula (3) can be rewritten as:

$$(1+K_{TV}\cdot T_V)R_{V0}+R_S(1-A\beta Y) \quad (5)$$

In formula (5), since temperature parameters are included only in $K_{TV}$ and Y, the following equation may be established:

$$R_{V0}K_{TV}T_V - R_SA\beta Y = 0$$

Therefore, $$R_{V0}K_{TV}T_V = R_SA\beta Y \quad (6)$$

As a result, equation (6) can be rewritten as:

$$Y/T_V = (R_{V0}K_{TV})/R_SA\beta \quad (7)$$

Since $T_V \approx T_S$ is set by the above-mentioned thermal coupling, the temperature detection element 11 and the transducer 12 can be set to yield the following temperature/voltage conversion characteristics from the temperature of the detection resistor $R_S$ to the voltage signal (Y):

$$Y/T_S \approx (R_{V0}K_{TX})/R_SA\beta$$

In the third embodiment, various means may be used as the temperature detection element 11. For example, a resistor having the temperature coefficient of a significant value, a semiconductor such as a thermistor and a posister, a thermocouple, and the like may be used. A junction voltage of an element such as a transistor and a diode may also be utilized.

The multiplier 13 may comprise a multiplier circuit (VCA) utilizing the $V_{BE}$ (base-emitter voltage) characteristics of a transistor or a circuit using a resistance change area such as an FET. In addition, a combined circuit of a lamp such as an LED, and a CdS cell may be used.

As described above, according to the second aspect of the present invention, since a drive current flowing through the voice coil of the speaker directly flows through the current detection element, the current detection element exhibits almost the same increase in temperature as an increase in temperature of the voice coil. The current detection element and the temperature sensitive means or temperature detection means are thermally coupled. Therefore, the voice coil and the temperature sensitive means or temperature detection means undergo the same increase in temperature, thus controlling positive feedback. Therefore, the above-mentioned temperature control can be performed.

What is claimed is:

1. An amplifier for driving a speaker as a load, comprising:
   current detection means inserted in series with said speaker;
   feed back means for positively feeding back a detection output of said current detection means for generating a negative resistance component in an output impedance, thereby equivalently eliminating or invalidating a DC resistance component of voice coil of said speaker;
   said current detection means being formed of a member which has a heat radiation resistance and a thermal time constant for setting an increase in temperature of the member to be almost equivalent to that of voice coil material of said speaker; and
   temperature sensitive means which has a predetermined temperature coefficient and is thermally coupled to the current detection means;
   a feedback amount of said detection output being controlled by an electrical change amount corresponding to temperature of said temperature sensitive means.

2. An amplifier for driving a speaker as a load, comprising:
   current detection means inserted in series with said speaker;
   feed back means for positively feeding back a detection output of said current detection means for generating a negative resistance component in an output impedance, thereby equivalently eliminating or invalidating the DC resistance component of voice coil of said speaker;
   said current detection means being formed of a member which has a heat radiation resistance and a thermal time constant for setting an increase in temperature of the member to be almost equivalent to that of voice coil material of said speaker;
   temperature detection means thermally coupled to the current detection means; and
   multiplication means for multiplying a detection signal from the temperature detection means with a feedback gain of said detection output.

* * * * *